(12) United States Patent
Zhang et al.

(10) Patent No.: US 12,433,040 B2
(45) Date of Patent: Sep. 30, 2025

(54) SLICED CELL PHOTOVOLTAIC MODULE

(71) Applicants: TRINA SOLAR CO., LTD, Changzhou (CN); TRINA SOLAR (CHANGZHOU) SCIENCE & TECHNOLOGY CO., LTD, Changzhou (CN)

(72) Inventors: Shu Zhang, Changzhou (CN); Junpan Guo, Changzhou (CN); Hongwei Huang, Changzhou (CN); Jifan Gao, Changzhou (CN); Le Wang, Changzhou (CN); Zhiqiang Feng, Changzhou (CN)

(73) Assignees: Trina Solar Co., Ltd, Changzhou (CN); Trina Solar (Changzhou) Science & Technology Co., Ltd, Changzhou (CN)

(*) Notice: Subject to any disclaimer, the term of this patent is extended or adjusted under 35 U.S.C. 154(b) by 222 days.

(21) Appl. No.: 17/761,562

(22) PCT Filed: May 28, 2020

(86) PCT No.: PCT/CN2020/092780
§ 371 (c)(1),
(2) Date: Mar. 17, 2022

(87) PCT Pub. No.: WO2021/051862
PCT Pub. Date: Mar. 25, 2021

(65) Prior Publication Data
US 2022/0384667 A1    Dec. 1, 2022

(30) Foreign Application Priority Data

Sep. 18, 2019  (CN) .......................... 201910883009.4
May 12, 2020  (CN) .......................... 202010399450.8

(51) Int. Cl.
| | | |
|---|---|---|
| H10F 19/90 | (2025.01) | |
| H10F 19/70 | (2025.01) | |
| H10F 77/00 | (2025.01) | |

(52) U.S. Cl.
CPC .......... *H10F 19/902* (2025.01); *H10F 19/70* (2025.01); *H10F 77/937* (2025.01)

(58) Field of Classification Search
None
See application file for complete search history.

(56) References Cited

U.S. PATENT DOCUMENTS

2012/0174959 A1    7/2012  Hasegawa
2016/0226438 A1*   8/2016  Gibson ................. H01L 31/044
(Continued)

FOREIGN PATENT DOCUMENTS

CN    102594210      7/2012
CN    103311349 A    9/2013
(Continued)

OTHER PUBLICATIONS

Machine translation of CN209000924U (Year: 2019).*
(Continued)

*Primary Examiner* — Ryan S Cannon
(74) *Attorney, Agent, or Firm* — HOVEY WILLIAMS LLP (57) ABSTRACT

Disclosed is a sliced cell photovoltaic module, comprising one or more cell units connected in series, wherein each cell unit comprises one cell string sequence or a plurality of cell string sequences connected in series or in parallel; each cell string sequence comprises one cell string or a plurality of cell strings connected in parallel by means of a bus bar; and each cell string comprises a plurality of small cell slices connected in series by means of connection materials; the spacing between the plurality of small cell slices is −2 to 5

(Continued)

mm, wherein each small cell slice is one of 2-8 independent small cell slices obtained by means of laser cutting a solar cell with a size of 156*156 to 300*300, etc.; each small cell slice has a positive electrode and a back electrode; and the positions of each positive electrode and each back electrode are superposed with each other or are respectively at the edges of two ends of the small cell slice. According to the photovoltaic module of the present application, the module power is greatly improved, and a sharp increase in a short-circuit current of the module cannot be caused, such that the power loss cannot be increased, and a potential failure risk, caused by an increase in a rated current of a junction box, of the module can also be avoided.

9 Claims, 5 Drawing Sheets

(56) References Cited

U.S. PATENT DOCUMENTS

2017/0179324 A1* 6/2017 Yang .................... H01L 31/049
2018/0367095 A1   12/2018 Morad et al.

FOREIGN PATENT DOCUMENTS

| CN | 106252446 | A |   | 12/2016 |   |           |
|----|-----------|---|---|---------|---|-----------|
| CN | 106960889 |   |   | 7/2017  |   |           |
| CN | 109285905 | A |   | 1/2019  |   |           |
| CN | 208336245 |   |   | 1/2019  |   |           |
| CN | 109301004 | A |   | 2/2019  |   |           |
| CN | 109360863 | A |   | 2/2019  |   |           |
| CN | 209000924 | U | * | 6/2019  | ..........  | H01L 31/044 |
| CN | 110491948 | A |   | 11/2019 |   |           |
| CN | 212380431 | U | * | 1/2021  |   |           |

OTHER PUBLICATIONS

Machine translation of CN212380431U (Year: 2021).*
International Search Report dated Jul. 8, 2020, in PCT/CN2020/092780 with translation.
Office Action dated May 25, 2024 in related Chinese Patent Application Serial No. 202010399450.8, 7 pages.
Office Action dated Jul. 11, 2023 in related European Patent Application Serial No. 20866281.7, 11 pages.
Machine Translation of CN106960889, 6 pages.
Machine Translation of CN208336245, 6 pages.
Machine Translation of CN103311349, 9 pages.
Office Action mailed Apr. 11, 2025 in corresponding Vietnamese Patent Application 1-2021-04567 (with English translation), 4 pages.
Office Action mailed Mar. 4, 2025 in corresponding Chinese Patent Application 202010399450.8 (with English translation), 10 pages.

* cited by examiner

SLICED CELL PHOTOVOLTAIC MODULE

RELATED APPLICATIONS

This application is the National Stage, under 35 U.S.C. § 371, of International Patent Application No. PCT/CN2020/092780, filed May 28, 2020, which claims priority to Chinese Patent Application No. 202010399450.8, filed May 12, 2020, and to Chinese Patent Application No. 201910883009.4, filed Sep. 18, 2019. The entireties of each of the above-identified, prior-filed patent applications is hereby incorporated by reference into the present National Stage application.

TECHNICAL FIELD

The present application belongs to the technical field of solar energy, and specifically relates to a sliced cell photovoltaic module.

BACKGROUND

Conventional solar modules generally use an entire battery cell or a half cell slice cut from an entire battery cell through laser, and the size of a battery cell is typically 156*156 mm. A plurality of cell slices form an array of cell slices and are connected into a circuit through series connection or series-parallel connection. An array of cell slices generally adopts an arrangement of 6 strings of cells in the longitudinal direction, and the short-circuit current of a module is generally the current through the entire cell slice. As the market's demand for high-power modules continues to increase, under the circumstance that the efficiency improvement of the conventional battery technology is gradually limited, enlarging the area of silicon slice and introducing large silicon slice has gradually become a shortcut to quickly increase the power and efficiency of modules. Although the introduction of large silicon slice has improved the power of modules, it also results in at least several shortcomings. First, while the short-circuit current Isc of the module significantly improves, the rated current of the module junction box and the performance of the bypass diode also need to be improved. When the current reaches a certain level, the existing bypass diode can no longer satisfy the need. At the same time, when the bypass diode in the junction box is short-circuited, the large current will increase the heating and burning risk of the junction box. Second, the increased size and width of modules are beyond the production capacity of glass factories in the existing industry, which requires equipment upgrades and innovations, as well as the increase in costs. Moreover, it is difficult to achieve bypass diode connection for non-standard modules.

Therefore, a photovoltaic module is needed to be designed, which can increase the battery numbers and improve power while avoiding the above-mentioned shortcomings.

SUMMARY

In order to solve the above problems, the present application provides a sliced cell photovoltaic module. While introducing large size silicon slice and improving the power of the module, the short-circuit current Isc and the size and width of the module will not be significantly increased, reducing the power loss of the solar cell module and improving the hot-spot power loss of the solar cell module.

For this reason, the present application applies the following technical solutions:

A sliced cell photovoltaic module comprises one or more cell units connected in series, each of the cell units comprises a cell string sequence or a plurality of cell string sequences connected in series or parallel, each cell string sequence comprises one cell string or a plurality of cell strings connected in parallel through a bus bar, each cell string comprises a plurality of small cell slices connected in series through a connection material, and a spacing between the plurality of small cell slices is −2 to 5 mm; each of the small cell slices is one of 2-8 independent small cell slices which are laser-cut from a 156*156 to 300*300 mm solar cell, each small cell slice has a positive electrode and a back electrode, and each of the positive electrodes and each of the back electrodes are positioned mutually coinciding or are on the edges of both ends of the small cell slice respectively.

Optionally, each of the cell units comprises two cell string sequences or comprises one cell string sequence, and each of the cell units is connected in series with each other through a middle bus bar.

Optionally, each of the cell string sequence is formed based on one same cell string or is formed by splicing two cell strings.

Optionally, when the cell string sequence is one same cell string, the cell string is divided into a first half cell string and a second half cell string taking a middle point of the cell string as a boundary, the small cell slices in the first half cell string and the second half cell string are in opposite interconnecting directions, and the spacing between two small cell slices at the boundary is larger than the spacing between other adjacent small cell slices; when the cell string sequence is formed by splicing two cell strings, every small cell slice in the two cell strings is in the same direction as the interconnecting direction of an interconnecting bar, the interconnecting direction of the two cell strings are opposite and the two cell strings are spliced at the bus bar to form one cell string sequence, and the spacing between two small cell slices at the splice is larger than the spacing between other adjacent small cell slices.

Optionally, in each of the cell units, taking a middle bus bar as a boundary, the part above the middle bus bar is an upper part cell string while the part below the middle bus bar is a lower part cell string, the upper part of cell string and the lower part of cell string are connected in parallel with each other, and each battery cell is connected in parallel with a bypass diode.

Optionally, the sliced cell photovoltaic module comprises three cell units and three bypass diodes connected in parallel to corresponding cell units, which are respectively a first bypass diode, a second bypass diode and a third bypass diode, the three bypass diodes are all at a middle position in the longitudinal direction of the sliced cell photovoltaic module, and the third bypass diode is connected in parallel to a cell string of a corresponding cell unit through a jumper and a middle bus bar; the jumper is configured to transmit the module current under the normal operating condition of the sliced cell photovoltaic module, voltages of both ends of the first bypass diode and the second bypass diode are the same, and voltages of both ends of the third bypass diode are half of the voltages of both ends of the first bypass diode.

Optionally, one or more cell units comprises a first cell unit comprising one cell string sequence; the sliced cell photovoltaic module further comprises one or more bypass diodes, the bypass diodes are all at a middle position in the longitudinal direction of the sliced cell photovoltaic module, and at least one bypass diode is connected in parallel to a cell string of the first cell unit comprising one cell string sequence, through a jumper and a middle bus bar; the jumper is configured to transmit the module current under the normal operating condition of the sliced cell photovoltaic module, voltages of both ends of the bypass diodes connected to the jumper are half of the voltages of both ends of the bypass diodes which are not connected to the jumper; when the number of the bypass diodes connected to the jumper is two or more, voltages of both ends of the bypass diodes connected to the jumper are all the same.

Optionally, the jumper is set between a cell string and the edge of a glass, between a cell string and another cell string, or on the back of a cell string; when the jumper is set on the back of a cell string, an insulating material is configured to isolate the jumper and the cell string.

Optionally, when a first jumper of the jumper is set between a cell string and the edge of a glass or between a cell string and another cell string, a first cell string sequence of the cell string sequences is connected to the first jumper, a second cell string sequence is adjacent to the first cell string sequence; if there is no jumper between the second cell string sequence and the first cell string sequence, then a cell string of the first cell string sequence and an adjacent cell string of the second cell string sequence have the opposite polarities; if the second cell string sequence is not connected to a jumper and the first jumper is between the second cell string sequence and the first cell string sequence, then a cell string of the first cell string sequence and an adjacent cell string of the second cell string sequence have the same polarities; if the second jumper between the first cell string sequence and the second cell string sequence, a cell string of the first cell string sequence and an adjacent cell string of the second cell string sequence have the same polarities; if the second cell string sequence is connected to the second jumper and there is only the first jumper or the second jumper between the first cell string sequence and the second cell string sequence, then a cell string of the first cell string sequence and an adjacent cell string of the second cell string sequence have the same polarities; if the second cell string sequence is connected to the second jumper and there are only the first jumper and the second jumper between the first cell string sequence and the second cell string sequence, a cell string of the first cell string sequence and an adjacent cell string of the second cell string sequence have the opposite polarities.

Optionally, each of the cell units comprises one cell string sequence, each of the cell units is connected in parallel with each other through a middle bus bar, and each of the cell units is connected in parallel to one bypass diode.

Optionally, each of the bypass diodes is at a middle position in the longitudinal direction of the sliced cell photovoltaic module, the positive electrode of each bypass diode directly connects to the negative electrode of a cell string of a corresponding battery cell, and the negative electrode of each bypass diode is connected to the positive electrode of a cell string of a corresponding battery unit through a jumper.

Optionally, the size of the solar cell is 166*166 to 300*300 mm.

Optionally, the small cell slice is one of 3 or 4 independent small cell slices laser-cut from the solar cell.

Compared with the prior art, the present application has the following beneficial effects:

In the present application, the existing large-size silicon slices (156*156 mm to 300*300 mm) are laser-cut into 2-8 independent small cell slices of the same size, and then through circuit design, the above small cell slices are connected in series and parallel to form a cell string, a cell string sequence and a cell unit in sequence. On this basis, a battery module is then formed to achieve:

1. reducing the short-circuit current output of each small cell slice, thereby reducing the difficulty and risk of photovoltaic module circuit design;
2. reducing the power loss of the interconnection bar connected to small cell slices, thereby increasing the power output of the photovoltaic module; and
3. cell slices with relatively smaller area obtained by cutting as compared to a large-size solar cell slice, which can significantly improve the flexibility of photovoltaic module design.

BRIEF DESCRIPTION OF THE DRAWINGS

wherein 1 is a small cell slice, 2 is a cell string, 3 is a cell string sequence, 3A is a first cell string sequence, 3B is a second cell string sequence, 4 is a cell unit, 4A is a first cell unit, 201 is a first half cell string, 202 is a second half cell string, 5 is an upper part cell string, 6 is a lower part cell string, 7 is a bypass diode, 7A is a first bypass diode, 7B is a second bypass diode, 7C is a third bypass diode, 8 is a jumper, 8A is a first jumper, 8B is a second jumper, 9 is a connection material, 10 is a bus bar, and 11 is a middle bus bar.

DETAILED DESCRIPTION

Embodiment 1

Figure 1:
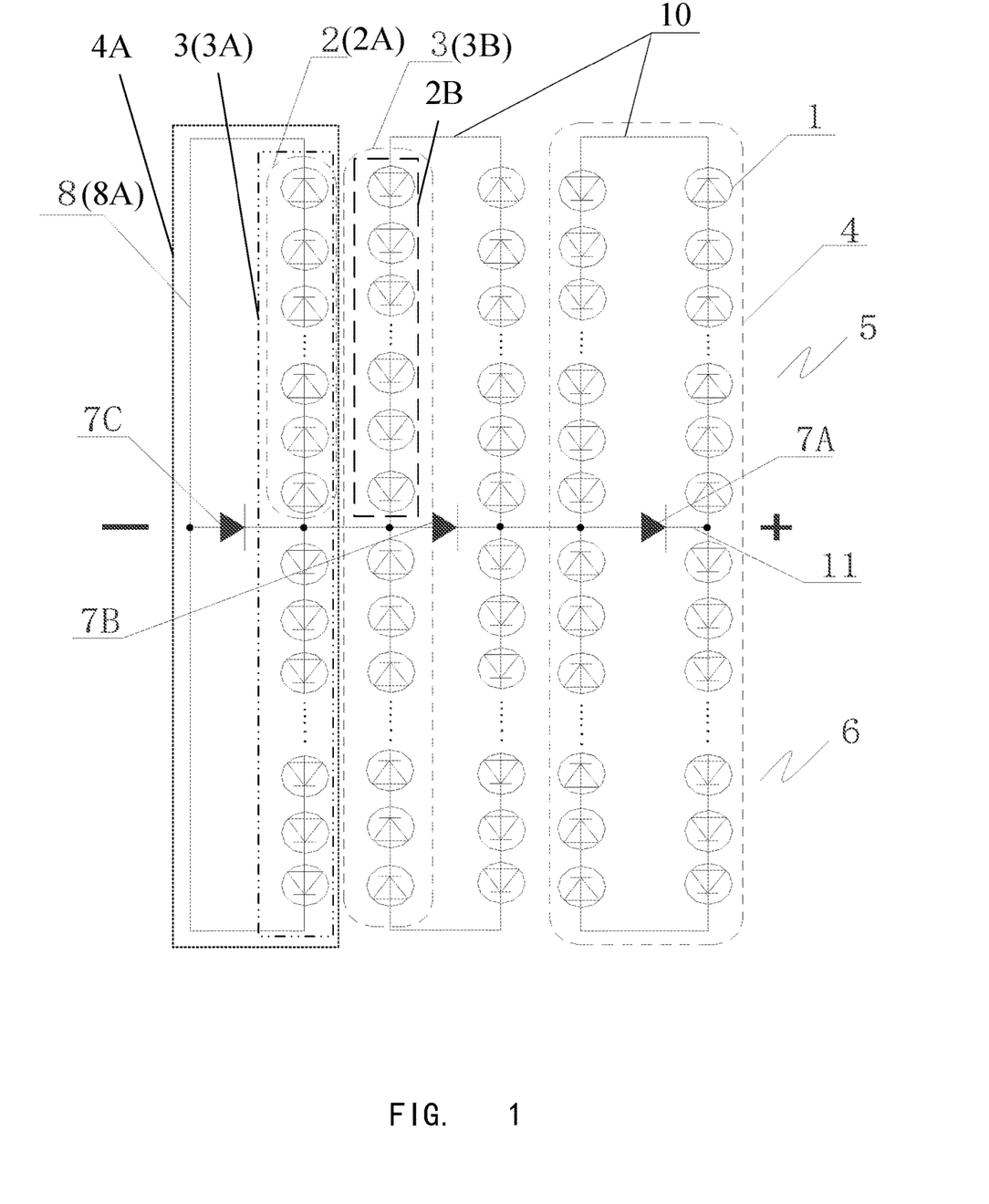
FIG. 1 illustrates a circuit diagram of Embodiment 1 of the present application.
Figure 2:
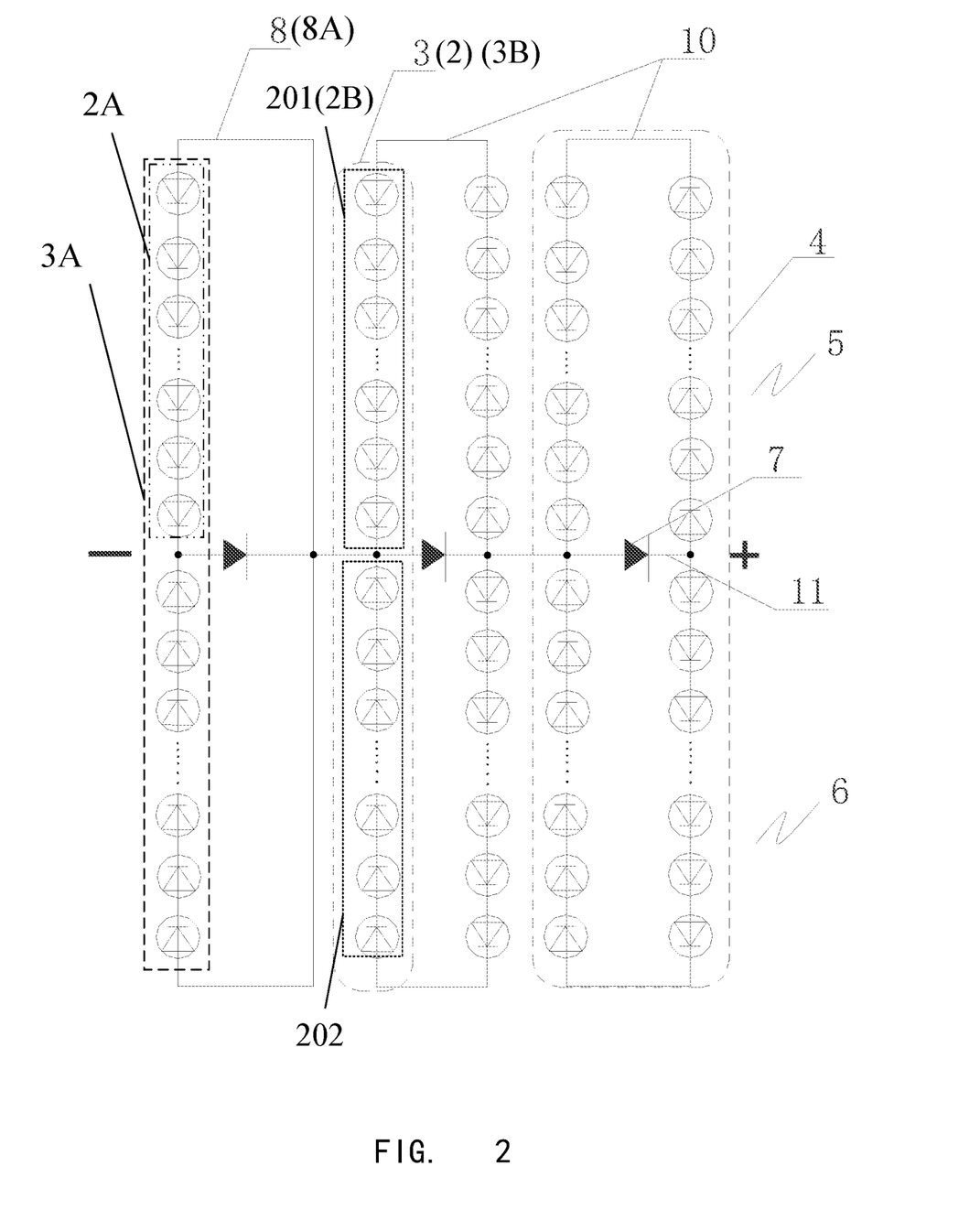
FIG. 2 illustrates another circuit diagram of Embodiment 1 of the present application.
Figure 4:
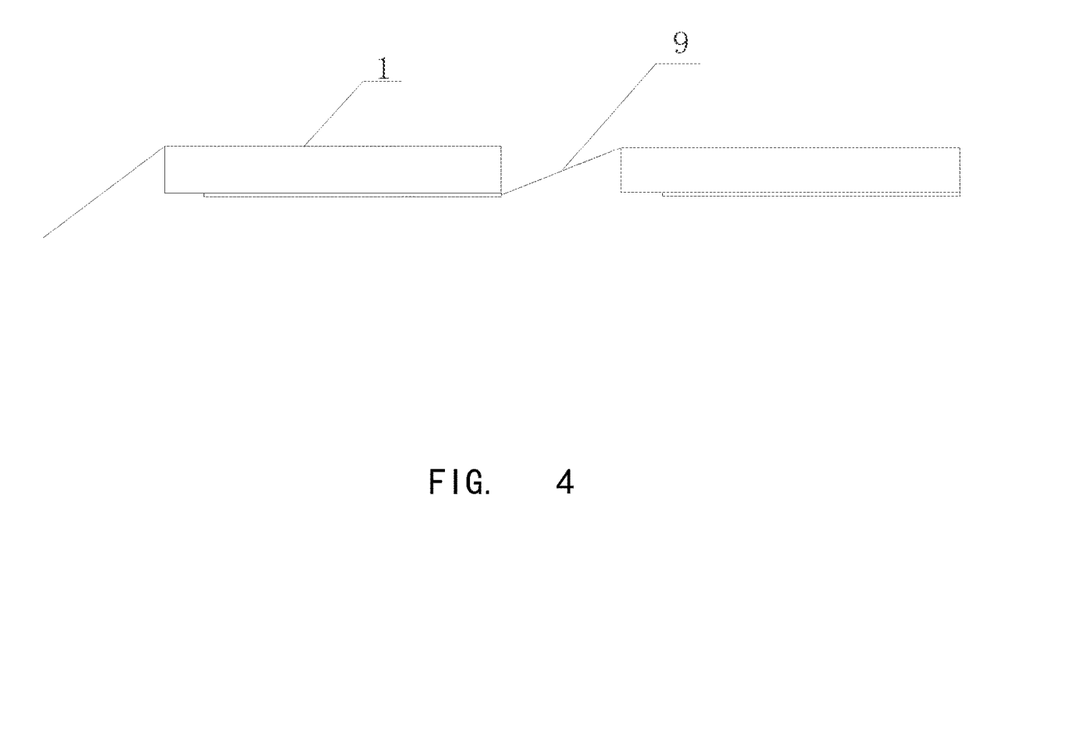
FIG. 4 illustrates a connection method of small cell slices of the present application.
Figure 5:
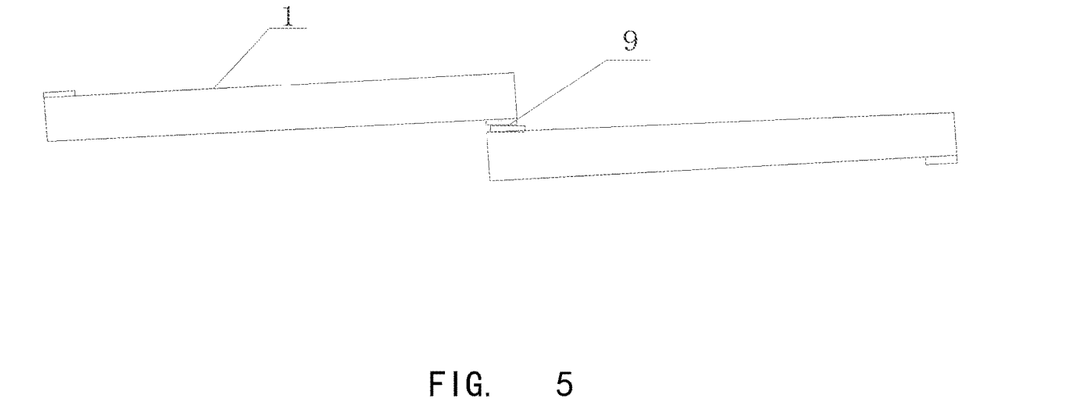
FIG. 5 illustrates another connection method of small cell slices of the present application.

In the present embodiment, a solar cell with a size of 156 mm*156 mm to 300 mm*300 mm is laser-cut into 2-8 independent small cell slices 1 which are configured in the circuits as shown in FIG. 1 and FIG. 2. Each small cell slice 1 has a positive electrode and a back electrode, and each of the positive electrodes and each of the back electrodes are positioned mutually coinciding or are on the edges of both ends of the small cell slice 1 respectively. The small cell slices 1, after cutting, are connected in series through a connection material 9 as shown in FIG. 4 or FIG. 5 to form a cell string 2, and a spacing between a small cell slice 1 and another small cell slice 1 connected in series is −2 to 5 mm. As shown in FIG. 4, there is a certain spacing between adjacent small cell slices 1 and the maximum spacing can be 5 mm; as shown in FIG. 5, there is an overlap between adjacent small cell slices 1, which refers to a negative distance, and the adjacent small cell slices 1 can overlap at most 2 mm, that is, the spacing is −2 mm. Specifically, the connection material 9 may be a tin-coated copper tape or a conductive adhesive bonding material. The tin-coated copper tape may be a flat tape, a round shape, or a triangular-like shape. The conductive adhesive bonding material may be in the form of flexible tape or a paste, etc., and the conductive particles are closely contacted to conduct by heat-press solidification. The conductive particles may be silver, nickel, silver-coated or graphite, etc., which is not limited in the present application. The small cell slices 1 are connected in series to form a cell string 2 through the connection material 9 as described above, and then the cell strings 2 are to be arranged and connected.

In one embodiment, the size of the solar cell may also be 166 mm*166 mm to 300 mm*300 mm, or 200 mm*200 mm to 300 mm*300 mm. A larger size of a solar cell helps to improve the power and efficiency of the module. Preferably, in order to match with the larger size of a solar cell, the small cell slice 1 is one of 3 or 4 independent small cell slices laser-cut from the solar cell. After equally cut into 3 slices, the size of the small cell slice 1 is 55.3 mm*166 mm to 100 mm*300 mm; after equally cut into 4 slices, the size of the small cell slice 1 is 41.5 mm*166 mm to 75 mm*300 mm. Therefore, cutting a solar cell into small cell slices can reduce the module short-circuit current output of each small cell slice, thereby reducing the difficulty and risk of photovoltaic module circuit design; reducing the power loss of the interconnection bar connected to small cell slices, thereby increasing the power output of the photovoltaic module; and obtaining small cell slices with a smaller area as compared to the large-size solar cell slice, thereby significantly improving the flexibility of photovoltaic module design.

It can be understood that the laser cutting in this embodiment is by way of average cutting.

The cell string sequence 3 is formed based on one same cell string, or is formed by splicing two cell strings. Taking FIG. 2 as an example, when the cell string sequence 3 is formed by one same cell string 2, the cell string 2 is divided into a first half cell string 201 and a second half cell string 202 taking a middle point of the cell string 2 as a boundary, change directions of small cell slices 1 in the first half cell string 201 and the second half cell string 202 so that the two half cell strings maintain opposite interconnecting directions, and the spacing between two small cell slices at the boundary is larger than the spacing between other adjacent small cell slices. When splicing two cell strings, the two cell strings 2 are connected in parallel through an interconnection bar to form a cell string sequence 3. At this time, small cell slices in the two cell strings 2 are in the same direction as the interconnecting direction of the interconnecting bar. By rotating one of the cell strings, the two cell strings maintain the opposite interconnecting direction and are spliced on the middle bus bar 11 to form a cell string sequence, and the spacing between two small cell slices at the splice is larger than the spacing between other adjacent small cell slices. Through the above design, the risk of potential failure of the photovoltaic module due to the increase in the rated current of the junction box can be significantly reduced.

The sliced cell photovoltaic module may comprise one or more cell string sequences 3 and one or more cell units 4, and the number of cell string sequences 3 and cell units 4 comprised in the sliced cell photovoltaic module is not limited in the present application. The one or more cell units 4 of the sliced cell photovoltaic module may comprise a first cell unit 4A, which comprises one cell string sequence 3.

The present embodiment will be described by taking a sliced cell photovoltaic module comprising five cell string sequences 3 and three cell units 4 as mentioned above as an example. Wherein two cell string sequences 3 are connected in series to form a cell unit 4 (right side of FIGS. 1 and 2), another two cell string sequence 3 are connected in series to form another cell unit 4 (middle of FIG. 1 and FIG. 2), and the remaining cell string sequence 3 independently forms a cell unit 4 (left side in FIG. 1 and FIG. 2). The above three cell units 4 are connected in series through a middle bus bar 11 to form a sliced cell photovoltaic module of the present embodiment, as shown in FIG. 1 and FIG. 2. The cell slice array comprising the small cell slices 1 in FIG. 1 and FIG. 2 roughly reflects the relative physical positions of the small cell slices 1, the cell strings 2, the cell string sequences 3 and the cell units 4.

Figure 3:
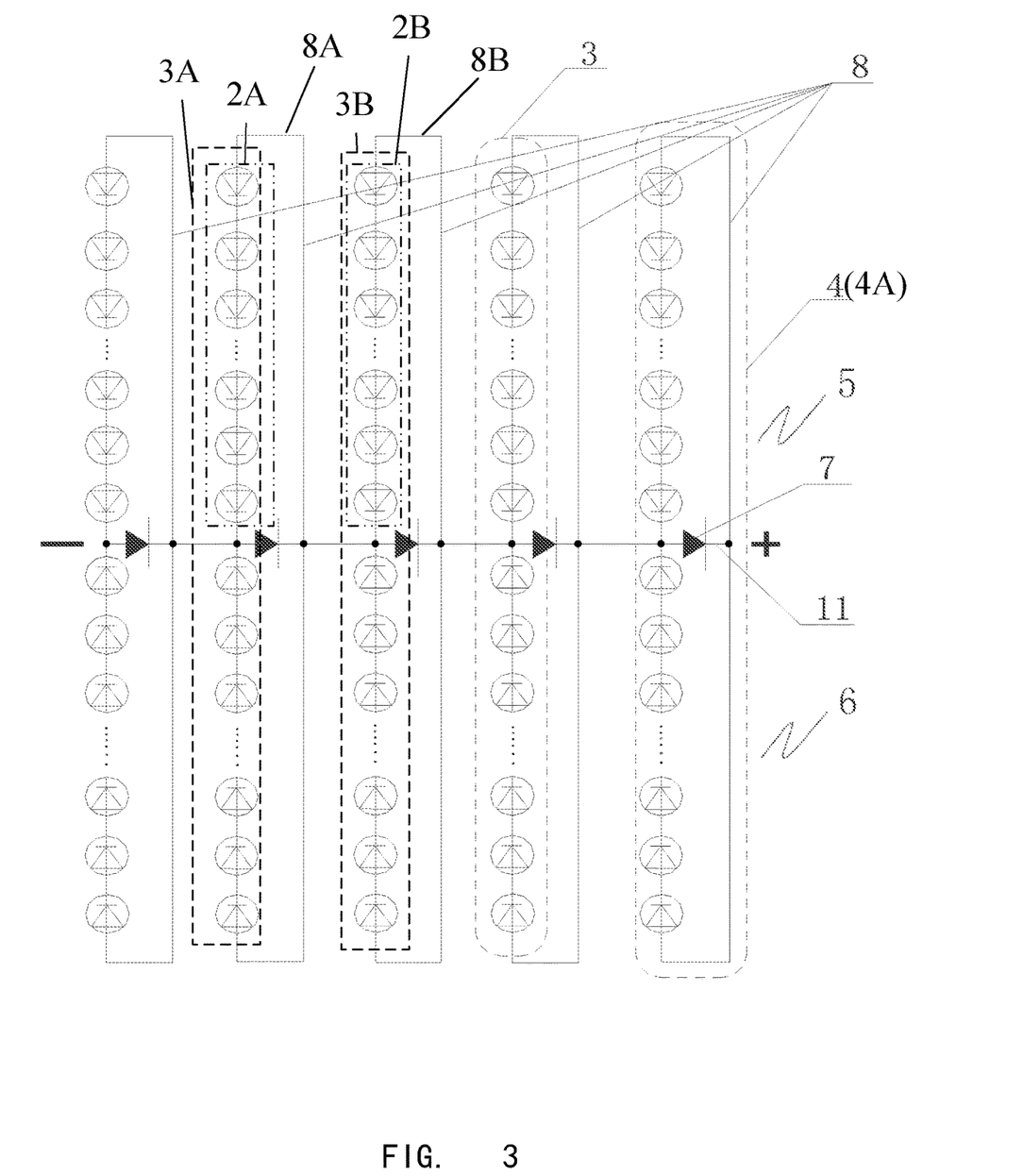
FIG. 3 illustrates a circuit diagram of Embodiment 2 of the present application.

The sliced cell photovoltaic module may comprise one or more bypass diodes 7. As shown in FIGS. 1-3, the bypass diodes 7 are all at the middle position in the longitudinal direction of the sliced cell photovoltaic module, and at least one bypass diode 7 is connected in parallel to a cell string of the first cell unit 4A through a jumper 8 and a middle bus bar 11. It should be noted that the middle position does not refer to the exact middle, but also includes the area near the exact middle. For example, the middle position may be at 4/8 in the longitudinal direction of the module (that is, at the exact middle), or at a range of 3/8, 5/8, etc. in the vicinity of the exact middle in the longitudinal direction of the module.

In each of the cell units 4, taking a middle bus bar 11 as a boundary, a part above the middle bus bar 11 is an upper part cell string 5 while a part below the middle bus bar 11 is a lower part cell string 6. The upper part of cell string 5 and the lower part of cell string 6 are connected in parallel with each other, and each cell unit 4 is connected in parallel to a bypass diode 7. The number of cell units 4 in the present embodiment is three, and each cell unit 4 is connected in parallel to a bypass diode 7, so the number of bypass diodes 7 in the present embodiment is three. For the convenience of description, the three bypass diodes 7 are respectively named as the first bypass diode 7A, the second bypass diode 7B and the third bypass diode 7C, and the three bypass diodes 7 are all at the middle position in the longitudinal direction of the sliced cell photovoltaic module, as shown in FIG. 1 and FIG. 2.

The voltages of both ends of the first, second, and third bypass diodes are as follows: the first case is that voltages of both ends of the third bypass diode 7C are half of the voltages of both ends of the first bypass diode 7A and the second bypass diode 7B; and the second case is the voltages of both ends of the first bypass diode, the second bypass diode and the third bypass diode are the same. Wherein the positive electrodes and the negative electrodes of the first bypass diode 7A and the second bypass diode 7B are respectively connected to the negative electrode and the positive electrode of a corresponding cell string through the middle bus bar 11; the third bypass diode 7C is connected in parallel to a corresponding cell string through a jumper 8 and a middle bus bar 11.

There are the following two cases for the connecting method between the third bypass diode 7C and the corresponding cell string:

The first case: As shown in FIG. 1, the positive electrode of the third bypass diode 7C is connected to the negative electrode of a cell string (for example, the cell string 2) through the jumper 8 and the middle bus bar 11, and the negative electrode of the third bypass diode 7C directly connects to the positive electrode of a cell string (for example, the cell string 2) through the middle bus bar 11, and at this time, the cell string of the cell unit (the cell unit on the left side of FIG. 1) connected to the jumper 8 and the adjacent cell string of the cell unit (the cell unit in the middle of FIG. 1) have the opposite polarities.

The second case: As shown in FIG. 2, the positive electrode of the third bypass diode 7C directly connects to the negative electrode of a cell string through the middle bus bar 11, and the negative electrode of the third bypass diode 7C is connected to the positive electrode of a cell string through the middle bus bar 11 and the jumper, and at this time, the cell string of the cell unit (the cell unit on the left side of FIG. 2) connected to the jumper 8 and the adjacent cell string of the cell unit (the cell unit in the middle of FIG. 2) have the same polarities.

The jumper 8 can be set on the back of a cell string, between a cell string and the edge of a glass, or between a cell string and another cell string. If the jumper 8 is set on the back of a cell string, an insulating material is configured to isolate the jumper 8 and the cell string.

If the jumper 8 is positioned between a cell string and the edge of a glass, the cell string connected to the jumper 8 or the cell string connected in parallel with the third bypass diode 7C has the opposite polarities with the adjacent cell strings.

The sliced cell photovoltaic module of the present application may comprise one or more jumpers 8, and the number of jumpers 8 is not limited in the present application. The sliced cell photovoltaic module of the present embodiment comprises one jumper 8. As shown in FIG. 1 and FIG. 2, when a first jumper 8A is set between a cell string and the edge of a glass or between a cell string and another cell string, a first cell string sequence 3A of the cell string sequences is connected to the first jumper 8A and a second cell string sequence 3B is adjacent to the first cell string sequence 3A. The polarities of adjacent cell strings between adjacent cell string sequences can be divided into the following two cases:

As shown in FIG. 1, there is no jumper between the second cell string sequence 3B and the first cell string sequence 3A, a cell string 2A of the first cell string sequence 3A and a cell string 2B of the second cell string sequence 3B are adjacent, then the first cell string sequence 3A and the adjacent second cell string sequence 3B have the opposite polarities.

As shown in FIG. 2, the second cell string sequence 3B is not connected to a jumper and the first jumper 8A is between the first cell string sequence 3A and the second cell string sequence 3B, a cell string 2A of the first cell string sequence 3A and a cell string 2B of the second cell string series 3B are adjacent, then the cell string 2A of the first cell string sequence 3A and the cell string 2B of the second cell string series 3B have the same polarities. By introducing the design of jumpers, the problem of how to achieve the parallel connection of the cell strings and diodes is solved ingeniously, and bypass diodes can be easily connected to realize the bypass function. By introducing the design of jumpers, the power of sliced cell photovoltaic module is significantly improved, while at the same time, avoiding the large increase of the size and width of photovoltaic modules, thereby avoiding the problem that the size and width of photovoltaic module exceed the production capacity of glass manufacturers in the industry.

The jumper 8 is configured to transmit the module current under the normal operating condition of the module. The voltages of both ends of the diode corresponding to the cell unit connected to the jumper 8 are half of the voltages of both ends of the diode corresponding to the cell unit which are not connected to the jumper 8. When the cell unit connected by the jumper is shaded, the bypass diode starts to work, and the module current mainly flows from the bypass diode. The jumper and the cell unit will be gradually shielded to avoid damage to the shaded cell slice due to long-term overheating.

Embodiment 2

The present embodiment is different from Embodiment 1 from the following aspects, and the rest may refer to the description in Embodiment 1:

As shown in FIG. 3, in the present embodiment, each cell string sequence 3 respectively forms a cell unit 4 (also referred to as a first battery cell 4A), and there are five cell units 4 (or cell string sequences 3) in total. Each of the cell units 4 is connected in series with each other through the middle bus bar 11. In each of the cell units 4, taking a middle bus bar 11 as a boundary, the part above the middle bus bar 11 is an upper part cell string 5 while the part below the middle bus bar 11 is a lower part cell string 6. The upper part cell string 5 and the lower part cell string 6 are connected in parallel. Each battery cell 4 is connected in parallel to a bypass diode 7. The voltages of both ends of each bypass diodes 7 are the same, and all the bypass diodes 7 are at a middle position in the longitudinal direction of the module. It should be noted that the middle position does not refer to the exact middle, but also includes the area near the exact middle. For example, the middle position may be at 4/8 in the longitudinal direction of the module (that is, at the exact middle), or at a range of 5/8, 6/8, etc. in the vicinity of the middle in the longitudinal direction of the module. Each bypass diode 7 is connected in parallel to a cell string of a corresponding battery cell 4 through a jumper 8 and a middle bus bar 11. The positive electrode of the bypass diode 7 directly connects to the negative electrode of a corresponding cell string, and the negative electrode of the bypass diode 7 is connected to a positive electrode of a cell string through a jumper and a middle bus bar 11.

As shown in FIG. 3, the sliced cell photovoltaic module of the present embodiment comprises five jumpers 8. When a first jumper 8A is set between the cell string and the edge of a glass or between a cell string and another cell string, a first cell string sequence 3A within the cell string sequences is connected to the first jumper 8A, a second cell string sequence 3B is adjacent to the first cell string sequence 3A, and a cell string 2A of the first cell string sequence 3A and a cell string 2B of the second cell string sequence 3B are adjacent. There is only the first jumper 8A between the second cell string sequence 3B and the first cell string sequence 3A, then a cell string 2A of the first cell string sequence 3A and a cell string 2B of the second cell string sequence 3B have the same polarities. Similarly, when swapping the positions of the first cell string sequence 3A and the second cell string sequence 3B, and swapping the positions of the first jumper 8A and the second jumper 8B accordingly, there is only one second jumper 8B between the second cell string sequence 3B and the first cell string sequence 3A, and the cell string 2A of the first cell string sequence 3A and the cell string 2B of the second cell string sequence 3B still have the same polarities. By introducing the design of jumpers, the problem of how to achieve the parallel connection of cell strings and diodes is solved ingeniously, and bypass diodes can be easily connected to realize the bypass function.

The jumper 8 is configured to transmit the module current under the normal operating condition of the module. When the cell unit connected through the jumper 8 and the middle bus bar 11 is shaded, the bypass diode connected to the cell unit starts to work, and the module current mainly flows from the bypass diode. The jumper and the cell unit will be gradually shielded to avoid damage to the shaded cell slice due to long-term overheating.

Embodiment 3

Figure 6:
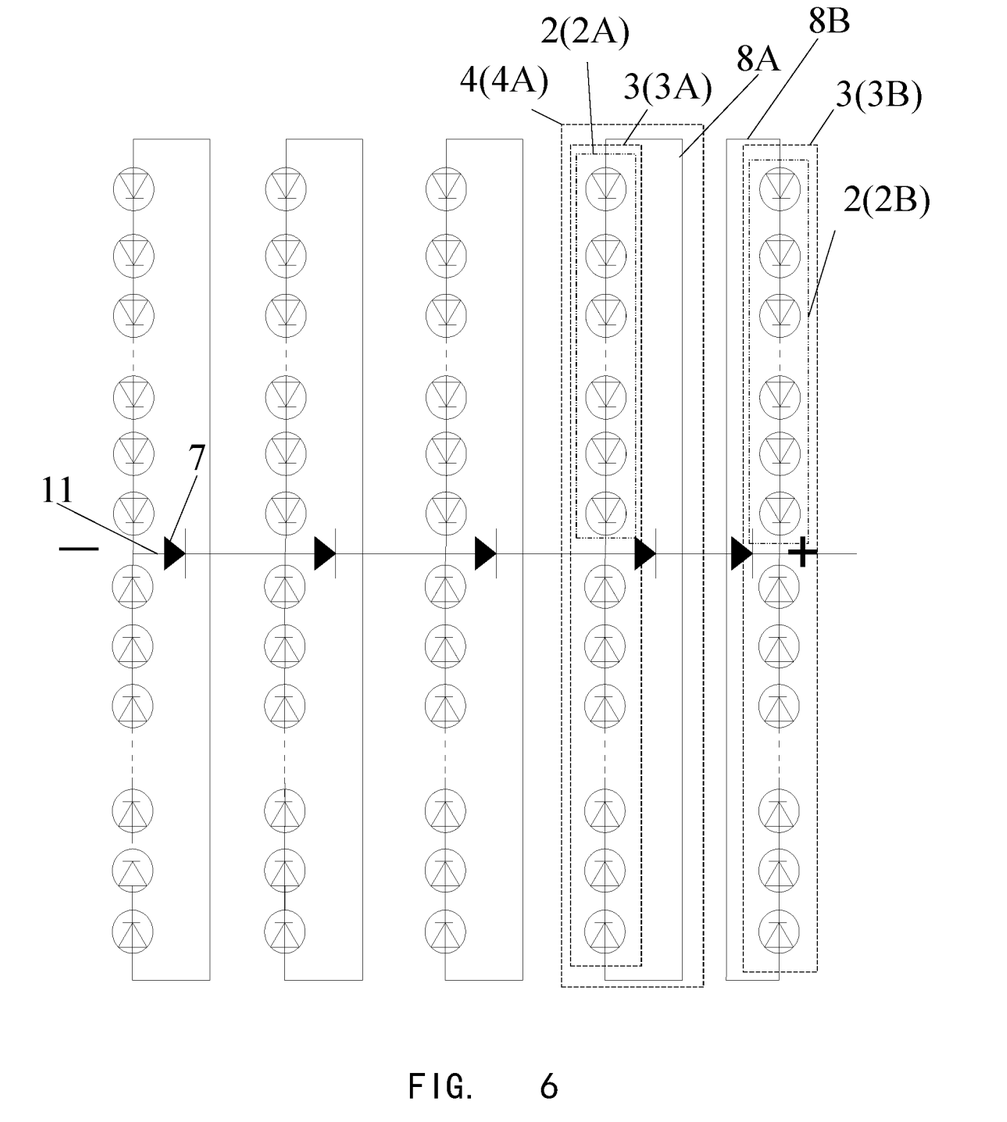
FIG. 6 illustrates a circuit diagram of Embodiment 3 of the present application.

The present embodiment is different from Embodiment 1 from the following aspects, and the rest may refer to the description in Embodiment 1:

As shown in FIG. 6, in the present embodiment, each cell string sequence 3 respectively forms a cell unit 4 (also referred to as a first battery cell 4A), and there are five cell units 4 (or cell string sequence 3) in total. Each of the cell units 4 is connected in series with each other through the middle bus bar 11. Each cell unit 4 is connected in parallel to a bypass diode 7. The voltages of both ends of each bypass diode 7 are the same, and all the bypass diodes 7 are at a middle position in the longitudinal direction of the module. It should be noted that the middle position does not refer to the exact middle, but also includes the area near the middle. For example, the middle position may be at 4/8 in the longitudinal direction of the module (that is, at the exact middle), or at a range of 5/8, 6/8, etc. in the vicinity of the middle in the longitudinal direction of the module. Each bypass diode 7 is connected in parallel to a cell string of a corresponding cell unit 4 through a jumper 8 and a middle bus bar 11. When a first jumper 8A is set between a cell string and another cell string, a first cell string sequence 3A of the cell string sequences is connected to the first jumper 8A, a second cell string sequence 3B is connected to a second jumper 8B, the second cell string sequence 3B is adjacent to the first cell string sequence 3A, and a cell string 2A of the first cell string sequence 3A and a cell string 2B of the second cell string series 3B are adjacent. There are only the first jumper 8A and the second jumper 8B between the second cell string sequence 3B and the first cell string sequence 3A, and the cell string 2A of the first cell string sequence 3A and the cell string 2B of the second cell string series 3B have the opposite polarities.

By introducing the design of jumpers, the problem of how to achieve the parallel connection of cell strings and diodes is solved ingeniously, and bypass diodes can be easily connected to realize the bypass function.

The jumper 8 is configured to transmit the module current under the normal operating condition of the module. When the cell unit connected through the jumper 8 and the middle bus bar 11 is shaded, the bypass diode connected to cell unit starts to work, and the module current mainly flows from the bypass diode. The jumper and the battery cell will be gradually shielded to avoid damage to the shaded cell slice due to long-term overheating.

In the present application, the bus bar 10 and the middle bus bar 11 may be of the same substance. For the convenience of description, the bus bar positioned at the middle position in the longitudinal direction of the module is named as the middle bus bar 11, and the bus bar 10 and middle bus bar 11 essentially have no difference.

The sliced cell photovoltaic module provided in the present application, through the circuit layout design, cuts the large silicon sheet (156 mm*156 mm~300 mm*300 mm or 166 mm*166 mm~300 mm*300 mm) into 2, 3, 4, 5, 6, 7 or 8 pieces, which are further connected to form a cell string, and then arranged to form a battery module. The sliced cell photovoltaic module of the present application can reduce the module short-circuit current output of each small cell slice, thereby reducing the difficulty and risk of photovoltaic module circuit design; reducing the power loss of the interconnection bar connected to small cell slices, thereby increasing the power output of the photovoltaic module; and compared with the large-size solar cell slice, the small cell slice obtained by cutting has a relatively smaller area, which significantly improves the flexibility of photovoltaic module design.

It should be noted that the specific embodiments described in this application are only examples to illustrate the spirit of the present application. Those skilled in the art to which this application belongs may make various modifications or additions to the described specific embodiments or substitute in a similar manner without deviating from the spirit of this application or going beyond the scope which the appended claims define. According to the design scheme of the small cell slices and the cell strings connected in parallel provided by the present application, the number of cell slices can be set as needed to achieve the best technical effect.

What is claimed is:

1. A sliced cell photovoltaic module,
wherein the sliced cell photovoltaic module comprises one or more cell units connected in series, each of the cell units comprises one cell string sequence or a plurality of cell string sequences connected in series or parallel, each of the cell string sequences comprises one cell string or a plurality of cell strings connected in parallel through a bus bar, each cell string comprises a plurality of small cell slices connected in series through a connection material, and a spacing between the plurality of small cell slices is −2 to 5 mm;
wherein each of the small cell slices is one of 2-8 independent small cell slices which are laser-cut from a 156*156 to 300*300 mm solar cell, each small cell slice has a positive electrode and a back electrode, and each of the positive electrodes and each of the back electrodes are positioned mutually coinciding or are on the edges of both ends of the small cell slice respectively,
wherein in each of the cell units, taking a middle bus bar as a boundary, the part above the middle bus bar is an upper part cell string while the part below the middle bus bar is a lower part cell string, the upper part cell string and the lower part cell string are connected in parallel with each other, and each cell unit is connected in parallel with a bypass diode,
wherein the sliced cell photovoltaic module comprises a first cell unit and a first bypass diode connected in parallel to the first cell unit, a second cell unit and a second bypass diode connected in parallel to the second cell unit, and a third cell unit and a third bypass diode connected in parallel to the third cell unit,
wherein the third bypass diode is connected to a first end of the upper part cell string and a second end of the lower part cell string within the third cell unit through a jumper,
wherein the first bypass diode, the second bypass diode, and the third bypass diode are all at a middle position in a longitudinal direction of the sliced cell photovoltaic module,
wherein the third bypass diode is connected in parallel to a cell string of the third cell unit through the jumper and the middle bus bar of the third cell unit, wherein the jumper is configured to transmit a module current under a normal operating condition of the sliced cell photovoltaic module, voltages of both ends of the first bypass diode and the second bypass diode are the same, and voltages of both ends of the third bypass diode are half of the voltages of both ends of the first bypass diode.

2. The sliced cell photovoltaic module according to claim 1, wherein each of the cell units comprises two cell string sequences or comprises one cell string sequence, and each of the cell units is connected in series with each other through the middle bus bar.

3. The sliced cell photovoltaic module according to claim 2, each of the cell string sequences is formed based on one same cell string or is formed by splicing two cell strings.

4. The sliced cell photovoltaic module according to claim 3,
wherein when the cell string sequence is one same cell string, the cell string is divided into a first half cell string and a second half cell string taking a middle point of the cell string as a boundary, the small cell slices in the first half cell string and the second half cell string are in the opposite interconnecting directions, and the spacing between two small cell slices at the boundary is larger than the spacing between other adjacent small cell slices;
when the cell string sequence is formed by splicing two cell strings, every small cell slice in the two cell strings is in the same direction as the interconnecting direction of an interconnecting bar, the interconnecting direction of the two cell strings are opposite and the two cell strings are spliced at the bus bar to form one of the cell string sequences, and the spacing between two small cell slices at the splice is larger than the spacing between other adjacent small cell slices.

5. The sliced cell photovoltaic module according to claim 1,
wherein the jumper is set between a cell string and the edge of a glass, between a cell string and another cell string, or on the back of a cell string; and
when the jumper is set on the back of a cell string, an insulating material is configured to isolate the jumper and the cell string.

6. The sliced cell photovoltaic module according to claim 5, wherein the jumper is a first jumper, and wherein the sliced cell photovoltaic module optionally includes a second jumper,
when the first jumper is set between a cell string and the edge of a glass or between a cell string and another cell string, a first cell string sequence of the cell string sequences is connected to the first jumper and a second cell string sequence is adjacent to the first cell string sequence, the first cell string sequence and the second cell string sequence are in adjacent cell units, wherein
if there is no jumper between the second cell string sequence and the first cell string sequence, a cell string of the first cell string sequence and an adjacent cell string of the second cell string sequence have the opposite polarities;
if the second cell string sequence is not connected to any jumper and the first jumper is between the first cell string sequence and the second cell string sequence, a cell string of the first cell string sequence and an adjacent cell string of the second cell string sequence have the same polarities.

7. The sliced cell photovoltaic module according to claim 1, wherein each of the cell units comprises one cell string sequence, each of the cell units is connected in series with each other through the middle bus bar, and each of the cell units is connected in parallel to one bypass diode.

8. The sliced cell photovoltaic module according to claim 1, wherein the size of the solar cell is 166*166 to 300*300 mm.

9. The sliced cell photovoltaic module according to claim 1, wherein the small cell slice is one of 3 or 4 independent small cell slices laser-cut from the solar cell.

* * * * *